United States Patent [19]

Fukunaga et al.

[11] Patent Number: 6,127,691
[45] Date of Patent: Oct. 3, 2000

[54] SEMICONDUCTOR LASER DEVICE

[75] Inventors: Toshiaki Fukunaga; Mitsugu Wada, both of Kanagawa-ken, Japan

[73] Assignee: Fuji Photo Film Co., Ltd., Kanagawa-ken, Japan

[21] Appl. No.: 09/199,815

[22] Filed: Nov. 25, 1998

[30] Foreign Application Priority Data

Nov. 25, 1997 [JP] Japan .................................. 9-323176
Nov. 9, 1998 [JP] Japan .................................. 10-317644

[51] Int. Cl.$^7$ .................................................. H01L 33/00
[52] U.S. Cl. ............................... 257/17; 257/18; 257/22; 257/94; 257/96; 257/97; 372/44; 372/45; 372/46; 438/46; 438/47
[58] Field of Search .................................. 257/94, 96, 97, 257/17, 18, 22; 438/46, 47; 372/44, 45, 46

[56] References Cited

U.S. PATENT DOCUMENTS

| 5,389,396 | 2/1995 | Razeghi ..................................... 427/58 |
| 5,488,233 | 1/1996 | Ishikawa et al. ......................... 257/94 |
| 5,617,437 | 4/1997 | Fukunaga ................................. 372/45 |
| 5,726,078 | 3/1998 | Razeghi ..................................... 438/39 |

FOREIGN PATENT DOCUMENTS 9-270558  10/1997  Japan ............................... H01S 3/18

OTHER PUBLICATIONS

"Influence of Strain on Lasing Performances of Al–Free Strained–Layer Ga(In)As(P)–GaInAsP–GaInP Quantum–Well Lasers Emitting at 0.78 < λ < 1.1 μm", Zhang, IEEE Journal of Selected Topics in Quantum Electronics, vol. 1, No. 2, Jun. 1, 1995, pp. 183–188, XP000521083.

"High–Power Highly–Reliable Operation of 0.98–μm In–GaAs–InGaP Strain–Compensated Single–Quantum–Well Lasers with Tensile–Strained InGaAsP Barriers", Sagawa et al., IEEE Journal of Selected Topics in Quantum Electronics, vol. 1, No. 2, Jun. 1, 1995, pp. 189–195, XP000521084.

"Reliable Operation of Strain–Compensated 1.06 μm InGaAs/InGaAsP/GaAs Single Quantum Well Lasers", Fukunaga et al., Applied Physics Letters, vol. 69, No. 2, Jul. 8, 1996, pp. 248–250, XP000599652.

IEEE Photonics Technology Letters, vol. 6, No. 4, 1994, pp. 465–467, "High Power 875 nm Al–Free Laser Diodes", Plano, W. E. et al.

Japanese Journal of Applied Physics, vol. 34, 1995, pp. L1175–1177, "Highly Reliable Operation of High–Power InGaAsP/InGaP/AlGaAs 0.8 μm Separate Confinement Heterostructure Lasers", Fukunaga, Toshiaki et al.

IEEE Journal of Selected Topics in Quantum Electronics, vol. 3, No. 2, 1997, pp. 181–187, "Strain–Overcompensated GaInP–AlGaInP Quantum–Well Laser Structures for Improved Reliability at High–Output Powers", Valster, A. et al.

Japanese Journal of Applied Physics, vol. 21, No. 6, 1982, pp. L323–L325, Unstable Regions in III–V Quaternary Solid Solutions Composition Plane Calculated with Strictly Regular Solution Approximation, Onabe, Kentaro.

Primary Examiner—William Mintel
Attorney, Agent, or Firm—Sughrue, Mion, Zinn, Macpeak & Seas, PLLC

[57] ABSTRACT

A semiconductor laser device comprises a GaAs substrate, a first cladding layer having either one of p-type electrical conductivity and n-type electrical conductivity, a first optical waveguide layer, an $In_{x2}Ga_{1-x2}As_{1-y2}P_{y2}$ first barrier layer, an $In_{x3}Ga_{1-x3}As_{1-y3}P_{y3}$ quantum well active layer, an $In_{x2}Ga_{1-x2}As_{1-y2}P_{y2}$ second barrier layer, a second optical waveguide layer, and a second cladding layer having the other electrical conductivity, the layers being overlaid in this order on the substrate. Each cladding layer and each optical waveguide layer have compositions, which are lattice matched with the substrate. Each of the first and second barrier layers has a tensile strain with respect to the substrate and is set such that a total layer thickness of the barrier layers may be 10 nm to 30 nm, and a product of a strain quantity of the tensile strain and the total layer thickness may be 0.05 nm to 0.2 nm. The active layer has a composition, which is lattice matched with the substrate, or a composition, which has a tensile strain of at most 0.003 with respect to the substrate.

2 Claims, 13 Drawing Sheets

130.
129.
128.
127.
126.
125.
124.
123.
122.
121.

131.

132.
133.

172.
171.
170.
169.
168.
167.
166.
165.
164.
163.
162.
161.

173.

174.
175.

250.
249.
248.
247.
246.
245.
244.
243.
242.
241.

250.
251.

253.
252.
254.

SEMICONDUCTOR LASER DEVICE

BACKGROUND OF THE INVENTION

1. Field of the Invention

This invention relates to a semiconductor laser device. This invention particularly relates to a composition of a semiconductor layer, which constitutes a semiconductor laser device.

2. Description of the Prior Art

As a semiconductor laser, which produces a laser beam having a wavelength in the band of 0.7 μm to 0.85 μm, there has heretofore been known a semiconductor laser comprising an n-GaAs substrate, an n-AlGaAs cladding layer, an n- or i-AlGaAs optical waveguide layer, an i-AlGaAs active layer, a p- or i-AlGaAs optical waveguide layer, a p-AlGaAs cladding layer, and a p-GaAs capping layer, which layers are formed on the substrate. However, such a structure has the drawbacks in that Al contained in the active layer is chemically active and apt to be oxidized, and therefore the end face of a resonator is readily deteriorated due to cleavage. Accordingly, the reliability of the semiconductor laser cannot be kept high.

Therefore, as a semiconductor laser, which produces a laser beam having a wavelength of a 875 nm band and is of the all Al-free type, there has heretofore been proposed a semiconductor laser comprising an n-GaAs substrate, an n-InGaP cladding layer, an undoped InGaAsP optical waveguide layer, a GaAs quantum well active layer, an undoped InGaAsP optical waveguide layer, a p-InGaP cladding layer, and a p-GaAs capping layer, which layers are formed on the substrate. Such a semiconductor laser is described in, for example, "IEEE Photonics Technology Letters," Vol. 6, No. 4, 1994, p. 465. However, the proposed Al-free semiconductor laser has the drawbacks in that the dependence of device characteristics upon temperatures is large and in that, though the maximum light output power is as high as 4.2W, the light emission efficiency becomes low due to the occurrence of leak current at light output power of above 1 W. The proposed Al-free semiconductor laser is not suitable as a high-output-power semiconductor laser for producing a laser beam having wavelengths of a short-wavelength band in the vicinity of 0.8 μm.

Also, as a semiconductor laser, which produces a laser beam having a wavelength of a 0.8 μm band and in which an active layer is of the Al-free type, there has heretofore been reported a semiconductor laser comprising an n-GaAs substrate, an n-AlGaAs cladding layer, an i-InGaP optical waveguide layer, an InGaAsP quantum well active layer, an i-InGaP optical waveguide layer, a p-AlGaAs cladding layer, and a p-GaAs capping layer, which layers are formed on the substrate. Such a semiconductor laser is described in, for example, "Jpn. J. Appl. Phys.," Vol. 34, 1995, pp. L1175–1177. However, the reported semiconductor laser has the drawbacks in that the temperature characteristics of the device characteristics are high due to carrier over flow. Therefore, the drive current cannot be kept small under the conditions for radiation a laser beam having a high intensity, and the reliability cannot be kept high due to an increase in the device temperature due to heat generation.

Further, a semiconductor laser having an enhanced reliability has been proposed in, for example, "IEEE Journal of Selected Topics in Quantum Electronics," Vol. 3, No. 2, 1997, p. 180. In the proposed semiconductor laser, a GaInP semiconductor of a composition ratio having a compressive strain with respect to a substrate is employed as an active layer, and an AlGaInP layer having a tensile strain of at least a level that cancels the compressive strain of the active layer is employed as a side barrier layer. Crystal structure relaxation is caused to occur in the vicinity of a radiating end face of the laser device, and the band gap at the end face is kept large. In this manner, light absorption at the time of laser beam radiation is kept low, and deterioration of the device due to light absorption at the end face is reduced. The reliability is there by enhanced. However, as described in "Jpn. J. Appl. Phys.," Vol. 21, 1982, p. L323, in cases where a semiconductor laser for producing a laser beam having a wavelength of an 800 nm band is to be constituted of an InGaAsP type of active layer, in the relationship between the InGaAsP type of composition ratio and the band gap, the composition region, in which phase separation is caused to occur, overlaps upon the composition ratio having a compressive strain. Therefore, it is difficult to form an active layer, which has a large compressive strain, with the InGaAsP type of semiconductor layer. Accordingly, it is difficult to constitute the semiconductor laser having an enhanced reliability, which is described in the literature shown above, as a semiconductor laser for producing a laser beam having a wavelength of the 800 nm band.

SUMMARY OF THE INVENTION

The primary object of the present invention is to provide a semiconductor laser device for producing a laser beam having a wavelength of a 0.8 μm band, which device has a high durability and has a high reliability under conditions for radiating a laser beam having a high intensity.

The present invention provides a first semiconductor laser device, comprising: a GaAs substrate, a first cladding layer, which has either one of p-type electrical conductivity and n-type electrical conductivity, a first optical waveguide layer, an $In_{x2}Ga_{1-x2}As_{1-y2}P_{y2}$ first barrier layer, an $In_{x3}Ga_{1-x3}As_{1-y3}P_{y3}$ quantum well active layer, an $In_{x2}Ga_{1-x2}As_{1-y2}P_{y2}$ second barrier layer, a second optical waveguide layer, and a second cladding layer, which has the other electrical conductivity, the layers being overlaid in this order on the GaAs substrate, wherein each of the first cladding layer and the second cladding layer has a composition, which is lattice matched with the GaAs substrate, each of the first optical waveguide layer and the second optical waveguide layer has a composition, which is lattice matched with the GaAs substrate, each of the first barrier layer and the second barrier layer has a tensile strain with respect to the GaAs substrate and is set such that a total layer thickness of the first barrier layer and the second barrier layer may fall within the range of 10 nm to 30 nm, and such that a product of a strain quantity of the tensile strain and the total layer thickness may fall within the range of 0.05 nm to 0.2 nm, and the $In_{x3}Ga_{1-x3}As_{1-y3}P_{y3}$ quantum well active layer has a composition selected from the group consisting of a composition, which is lattice matched with the GaAs substrate, and a composition, which has a tensile strain of at most 0.003 with respect to the GaAs substrate.

The present invention also provides a second semiconductor laser device, which is constituted in the same manner as that in the first semiconductor laser device, except that each of the first barrier layer and the second barrier layer has an $In_{x2}Ga_{1-x2}P$ type of composition.

The term "total layer thickness" as used herein means the sum of the layer thickness of the first barrier layer and the layer thickness of the second barrier layer.

The strain quantity of the tensile strain of each of the first and second barrier layers with respect to the GaAs substrate may be represented by the formula shown below.

$$\Delta_1 = (a_{GaAs} - a_1)/a_{GaAs}$$

wherein $\Delta_1$ represents the strain quantity, $a_{GaAs}$ represents the lattice constant of the GaAs substrate, and $a_1$ represents the lattice constant of the barrier layer.

The strain quantity of the tensile strain of the quantum well active layer with respect to the GaAs substrate may be represented by the formula shown below.

$$\Delta_2 = (a_{GaAs} - a_2)/a_{GaAs}$$

wherein $\Delta_2$ represents the strain quantity, $a_{GaAs}$ represents the lattice constant of the GaAs substrate, and $a_2$ represents the lattice constant of the active layer.

Ordinarily, in cases where the quantum well active layer is lattice matched with the GaAs substrate, it is meant that the strain quantity $\Delta_2$ falls within the range of $-0.0025 \leq \Delta_2 \leq 0.0025$. The composition of the quantum well active layer is selected from the group consisting of a composition, which is lattice matched with the GaAs substrate, and a composition, which has a tensile strain of at most 0.003 with respect to the GaAs substrate. Specifically, the composition of the quantum well active layer is selected from compositions, which satisfy the condition of $-0.0025 \leq \Delta_2 \leq 0.003$.

The first and second semiconductor laser devices in accordance with the present invention is constituted of a composition, in which the active layer does not contain Al. Therefore, the first and second semiconductor laser devices in accordance with the present invention have a higher durability than the conventional semiconductor laser for producing a laser beam having a wavelength of the 0.8 μm band. Also, with the first and second semiconductor laser devices in accordance with the present invention, which are provided with the InGaAsP or InGaP tensile strained barrier layers, lattice relaxation occurs in the vicinity of the active layer. By virtue of the lattice relaxation, the band gap can be kept large, and light absorption at a light radiating end face of the device can be reduced. Further, since the barrier height between the active layer and each barrier layer is kept large by the InGaAsP or InGaP tensile strained barrier layers, leakage of electrons and positive holes from the active layer to the optical waveguide layers can be reduced. As a result, the drive current can be kept small, and heat generation at the end face of the device can be restricted. Therefore, the reliability of the device under the conditions for radiation a laser beam having a high intensity can be enhanced.

DESCRIPTION OF THE PREFERRED EMBODIMENTS

The present invention will hereinbelow be described in further detail with reference to the accompanying drawings.

Figure 1:
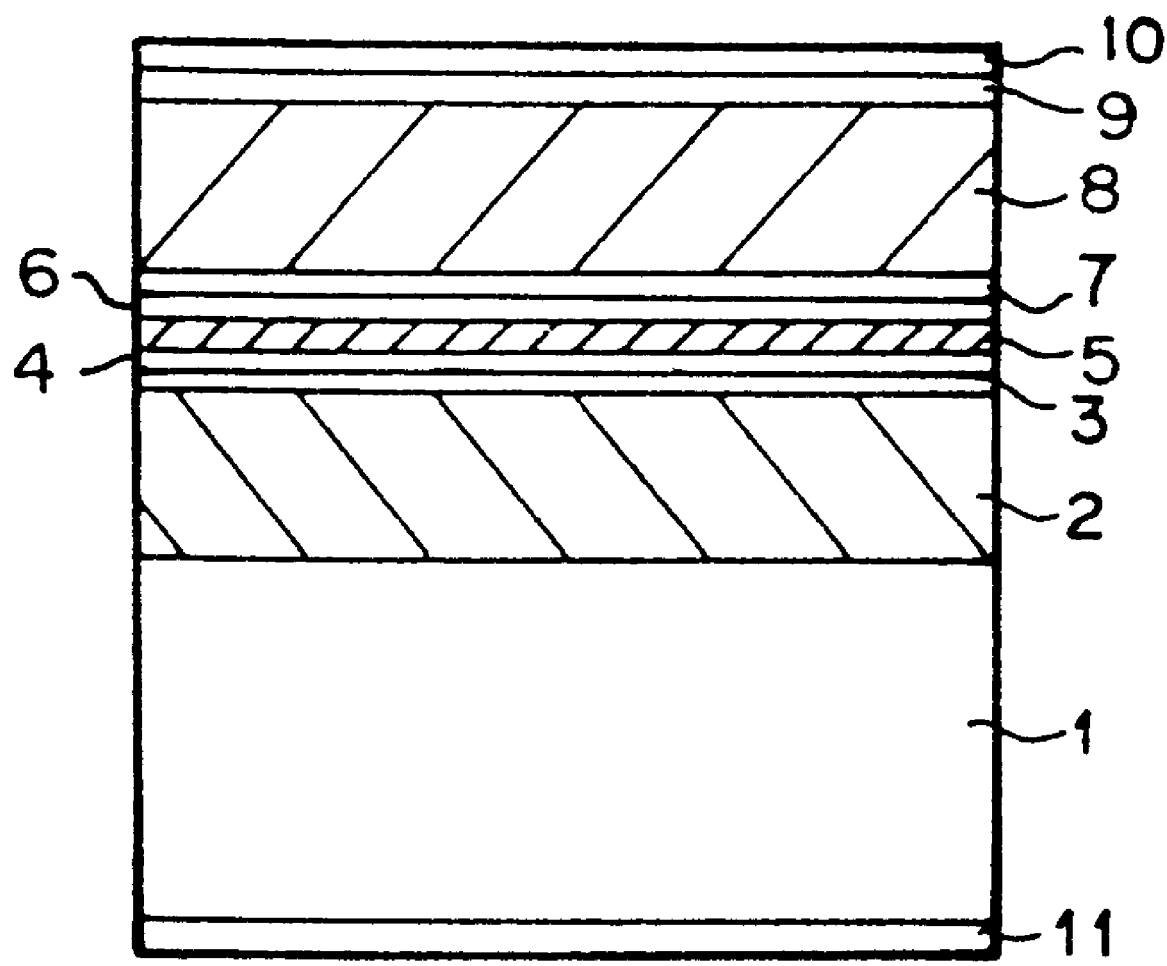
FIG. 1 is a sectional view showing a first embodiment of the semiconductor laser device in accordance with the present invention.

FIG. 1 is a sectional view showing a first embodiment of the semiconductor laser device in accordance with the present invention. The constitution of the semiconductor laser device and how it is produced will be described hereinbelow.

With reference to FIG. 1, an n-$Ga_{1-z1}Al_{z1}As$ cladding layer 2, an n- or i-$In_{x1}Ga_{1-x1}As_{1-y1}P_{y1}$ optical waveguide layer 3, an i-$In_{x2}Ga_{1-x2}As_{1-y2}P_{y2}$ tensile strained barrier layer 4, an $In_{x3}Ga_{1-x3}As_{1-y3}P_{y3}$ quantum well active layer 5, an i-$In_{x2}Ga_{1-x2}As_{1-y2}P_{y2}$ tensile strained barrier layer 6, a p- or i-$In_{x1}Ga_{1-x1}As_{1-y1}P_{y1}$ optical waveguide layer 7, a p-$Ga_{1-z1}Al_{z1}As$ cladding layer 8, and a p-GaAs contact layer 9 are formed on an n-GaAs substrate 1 with a metalorganic chemical vapor deposition process. Thereafter, a p-side electrode 10 is formed on the contact layer 9, and an n-side electrode 11 is formed on the substrate 1. Each of the cladding layers 2 and 8 is of a composition ratio, which is lattice matched with the GaAs substrate 1. Also, each of the optical waveguide layers 3 and 7 is of a composition ratio, which is lattice matched with the GaAs substrate 1. Besides the compositions described above, an InGaAlAsP type of semiconductor layer may be employed.

In this embodiment, the quantum well active layer 5 has a composition, which is lattice matched with the substrate 1. Also, each of the tensile strained barrier layers 4 and 6 is set such that the strain quantity with respect to the substrate 1 may be equal to 0.007 and such that the layer thickness may be equal to 5 nm. Alternatively, the quantum well active layer 5 may be set such that it may have a tensile strain of a strain quantity of at most 0.003 with respect to the GaAs substrate 1. The quantum well active layer 5 may also have a multiple quantum well structure. However, the product of the tensile strain quantity of the active layer 5 and the total thickness (the total layer thickness) of the active layer 5 should be at most 0.1 nm. The tensile strained barrier layers 4 and 6 may be set such that the total layer thickness of the two barrier layers 4 and 6 may fall within the range of 10 nm to 30 nm, and such that the product of the strain quantity of each barrier layer and the total layer thickness may fall within the range of 0.05 nm to 0.2 nm.

Figure 2:
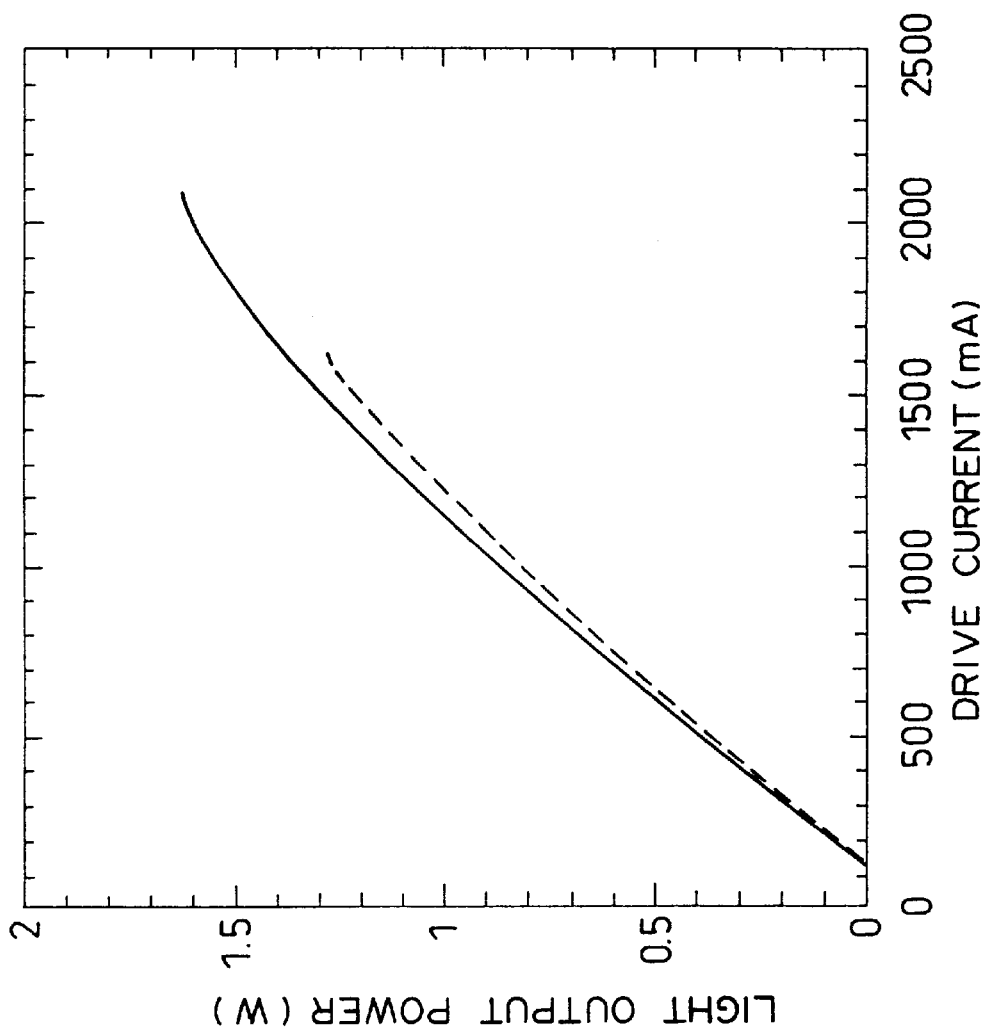
FIG. 2 is a graph showing the maximum light output power of the first embodiment of FIG. 1 and the maximum light output power of a semiconductor laser for comparison.
Figure 3:
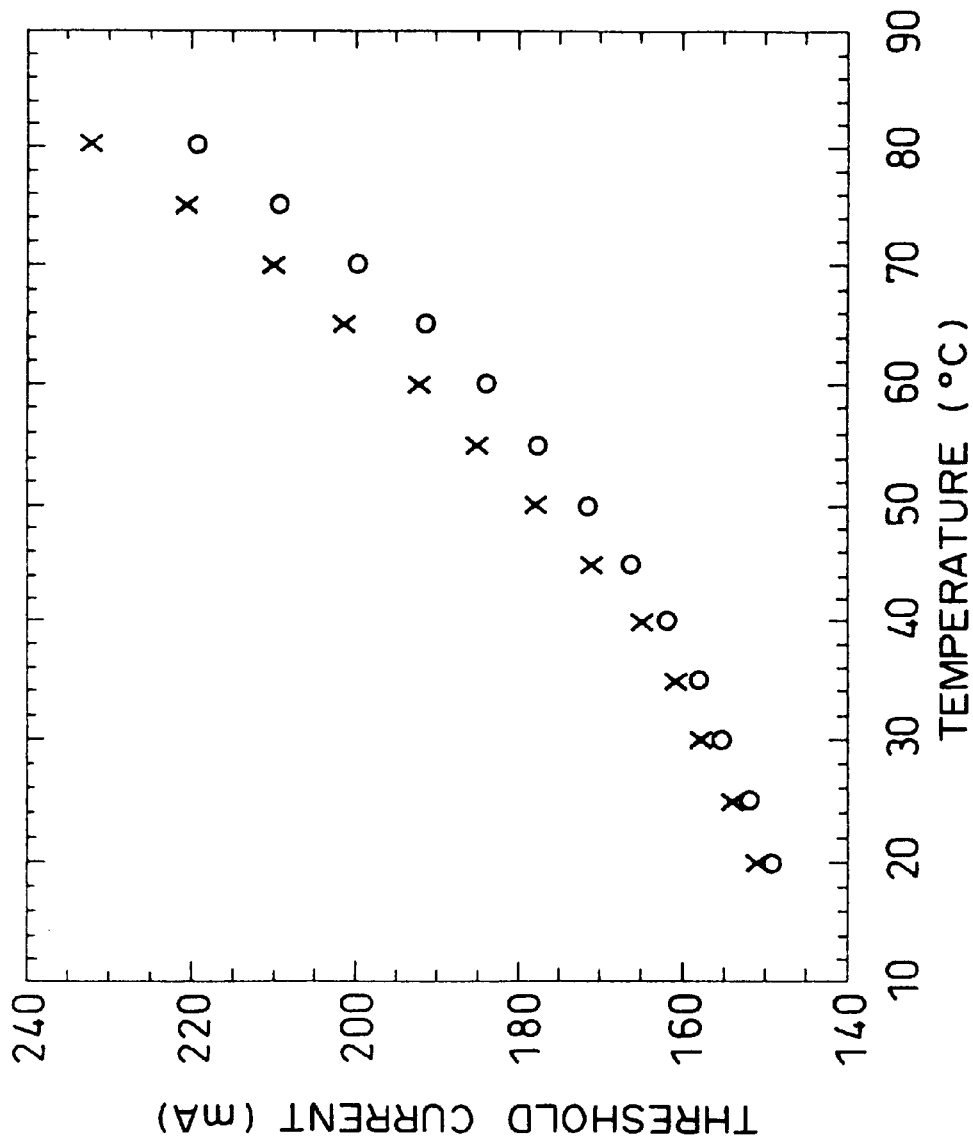
FIG. 3 is a graph showing dependence of a threshold current upon temperature in the first embodiment of FIG. 1 and the semiconductor laser for comparison.

Evaluations were made with respect to the aforesaid first embodiment of the semiconductor laser device in accordance with the present invention and a semiconductor laser device for comparison, which was formed in the same manner as that for the first embodiment, except that the tensile strained barrier layers were not formed, and which had a stripe having a width of 50 µm. The results shown in FIGS. 2 and 3 were obtained. In FIG. 2, the solid line indicates the maximum light output power of the semiconductor laser device in accordance with the present invention, which is provided with the tensile strained barrier layers. The broken line indicates the maximum light output power of the semiconductor laser device for comparison, which is not provided with the tensile strained barrier layers. In FIG. 3, the "o" mark indicates the dependence of a threshold current $I_{th}$ upon temperature in the semiconductor laser device in accordance with the present invention, and the "x" mark indicates the dependence of the threshold current $I_{th}$ upon temperature in the semiconductor laser device for comparison, which is not provided with the tensile strained barrier layers. From the results shown in FIG. 2, it was found that the maximum light output power of the semiconductor laser device in accordance with the present invention is larger by approximately 0.3 W than the maximum light output power of the semiconductor laser device for comparison, which is not provided with the tensile strained barrier layers. Also, from the results shown in FIG. 3, it was found that the dependence of the threshold current upon temperature in the semiconductor laser device in accordance with the present invention is lower than the dependence of the threshold current upon temperature in the semiconductor laser device for comparison, which is not provided with the tensile strained barrier layers.

Ordinarily, the dependence of the threshold current $I_{th}$ upon temperature is represented by the formula $I_{th}(T)=I_0 x e^{(T/T_o)}$, wherein To represents the characteristic temperature. A high characteristic temperature indicates that the dependence of the threshold current upon temperature in the device is low, and that the reliability under the conditions for radiating a laser beam having a high intensity is enhanced. In the semiconductor laser device, which is provided with the tensile strained barrier layers, in the temperature region of 20° C. to 50° C., To=223K, and the characteristic temperature increased by approximately 30K than in the semiconductor laser device for comparison, which is not provided with the tensile strained barrier layers. Also, in the high-temperature region of 50° C. to 80° C., the characteristic temperature of the semiconductor laser device in accordance with the present invention was 125K and was higher by approximately 15K than in the semiconductor laser device for comparison, which is not provided with the tensile strained barrier layers.

With the first embodiment of the semiconductor laser device in accordance with the present invention, the active layer 5 does not contain Al. Therefore, the semiconductor laser device in accordance with the present invention has a high durability. Also, with the first embodiment of the semiconductor laser devices in accordance with the present invention, in which the tensile strained barrier layers 4 and 6 are formed above and below the active layer 5, lattice relaxation occurs in the vicinity of the active layer 5. By virtue of the lattice relaxation, the band gap can be kept large, and therefore the light absorption at a light radiating end face of the device can be reduced. Further, since the barrier height between the active layer 5 and each barrier layer is kept large by the tensile strained barrier layers 4 and 6, leakage of electrons and positive holes from the active layer 5 to the optical waveguide layers 3 and 7 can be reduced. As a result, the drive current can be kept small, and heat generation at the end face of the device can be restricted. Therefore, the semiconductor laser device for radiating a laser beam having a wavelength of the 0.8 µm band, which device has a high reliability under the conditions for radiation a laser beam having a high intensity, can be obtained.

In the first embodiment described above, the GaAs substrate 1 has the n-type electrical conductivity. Alternatively, a substrate having the p-type electrical conductivity may be employed, and the semiconductor laser may be constituted through the growth from the p-type semiconductor layer.

The first embodiment described above is constituted such that the electrode may be formed over the entire area of the surface of the contact layer 9. Alternatively, the semiconductor laser device in accordance with the present invention may be constituted as a gain guiding type of stripe laser, in which an insulating film having a stripe current injection window is formed on the contact layer. Also, the semiconductor layer constitution in the aforesaid embodiment of the semiconductor laser device may be employed for a semiconductor laser device provided with a refractive index guiding mechanism, which is produced with ordinary photolithographic and dry etching techniques. The semiconductor layer constitution may also be employed for a semiconductor laser provided with a diffraction grating, an integrated optical circuit, and the like.

FIGS. 4A, 4B, 4C, 4D, 4E, and 4F are sectional views showing how a second embodiment of the semiconductor laser device in accordance with the present invention is produced. The layer constitution of the second embodiment and how it is produced will be described hereinbelow.

Figure 4A:
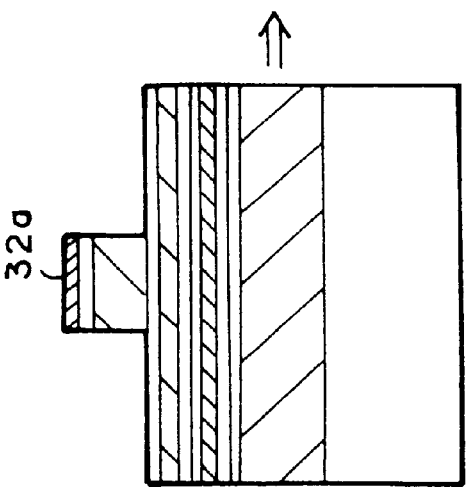
FIGS. 4A, 4B, 4C, 4D, 4E, and 4F are sectional views showing how a second embodiment of the semiconductor laser device in accordance with the present invention is produced.

As illustrated in FIG. 4A, an n-$Ga_{1-z1}Al_{z1}As$ cladding layer 22, an n- or i-$In_{x1}Ga_{1-x1}As_{1-y1}P_{y1}$ optical waveguide layer 23, an i-$In_{x2}Ga_{1-x2}As_{1-y2}P_{y2}$ tensile strained barrier layer 24, an $In_{x3}Ga_{1-x3}As_{1-y3}P_{y3}$ quantum well active layer 25, an i-$In_{x2}Ga_{1-x2}As_{1-y2}P_{y2}$ tensile strained barrier layer 26, a p- or i-$In_{x1}Ga_{1-x1}As_{1-y1}P_{y1}$ optical waveguide layer 27, a p-$Ga_{1-z1}Al_{z1}As$ upper first cladding layer 28, a p-$In_{x4}Ga_{1-z4}P$ etching blocking layer 29 (having a thickness of approximately 10 nm), a p-$Ga_{1-z1}Al_{z1}As$ upper second cladding layer 30, and a p-GaAs contact layer 31 are formed successively on an n-GaAs substrate 21 with a metalorganic chemical vapor deposition process. An insulating film 32, which may be constituted of $SiO_2$, or the like, is then formed on the contact layer 31.

Figure 4B:
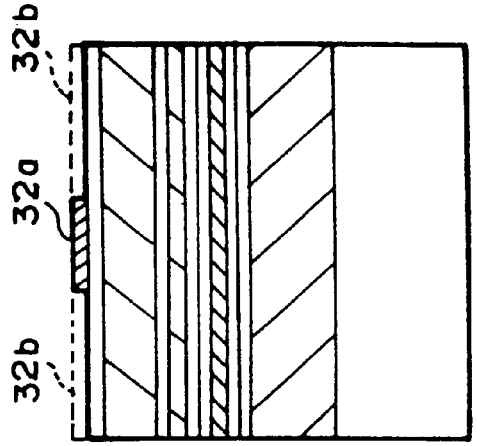
Figure 4C:
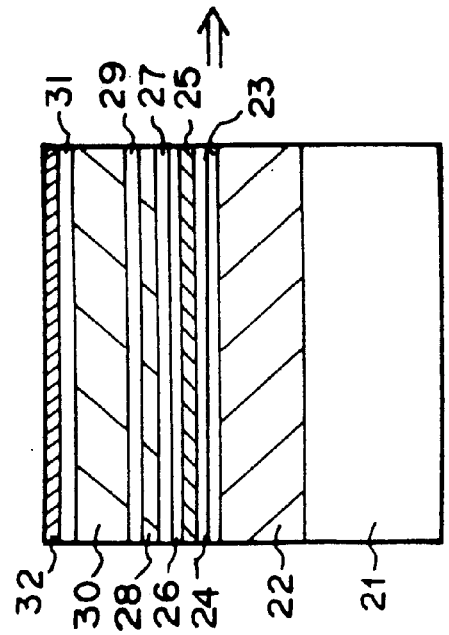
Figure 4D:
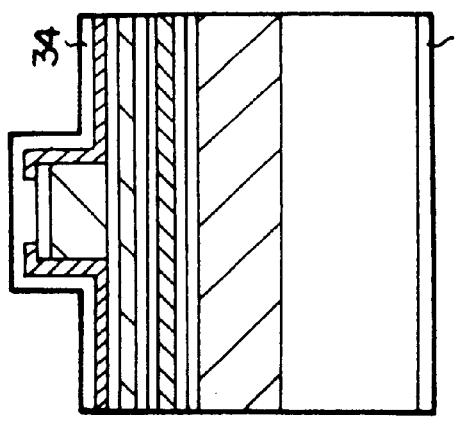
Figure 4E:
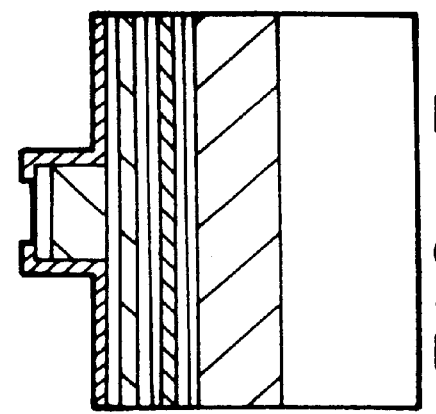
Figure 4F:
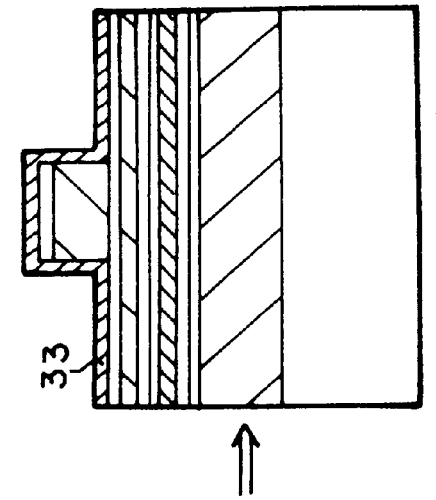

Thereafter, as illustrated in FIG. 4B, stripe portions 32b, 32b of the insulating film 32, each of which has a width of approximately 6 µm and which are located on opposite sides of a stripe portion 32a having a width of approximately 3 µm, are removed with an ordinary lithographic technique, such that the stripe portion 32a may not be removed. Also, as illustrated in FIG. 4C, the remaining stripe portion 32a of the insulating film 32 is utilized as a mask, and the epitaxial layers ranging from the contact layer 31 to the upper surface of the etching blocking layer 29 are removed with a wet etching technique. In this manner, a ridge stripe is formed. At this time, in cases where a sulfuric acid-hydrogen peroxide type of etching liquid is employed, the etching stops automatically at the etching blocking layer 29. The thickness of the upper first cladding layer 28 is adjusted such that the refractive index guiding in a fundamental transverse mode through the ridge stripe waveguide, which has been formed in the manner described above, can be achieved until a laser beam having a high intensity is radiated. Thereafter, as illustrated in FIG. 4D, the insulating film 32a is removed, and an insulating film 33 is formed over the entire areas of the surfaces of the ridge portion and the exposed etching blocking layer 29. As illustrated in FIG. 4E, the portion of the insulating film 33 at the top of the ridge stripe portion is then removed with an ordinary lithographic technique. Further, as illustrated in FIG. 4F, a p-side electrode 34 is formed such that it may cover the exposed contact layer 31. Thereafter, the bottom surface of the substrate 21 is polished, and an n-side electrode 35 is formed on the bottom surface of the substrate 21.

Thereafter, high-reflectivity coating is carried out on one of resonator surfaces, which have been formed by cleaving the sample, and low-reflectivity coating is carried out on the other resonator surface. Chip formation is then carried out. In this manner, the semiconductor laser device is formed. With the structure described above, a laser beam having a wavelength of the 0.8 µm band, which has a high intensity, can be produced while the fundamental transverse mode is being kept.

FIGS. 5A, 5B, 5C, 5D, 5E, and 5F are sectional views showing how a third embodiment of the semiconductor laser device in accordance with the present invention is produced. The layer constitution of the third embodiment and how it is produced will be described hereinbelow.

Figure 5A:
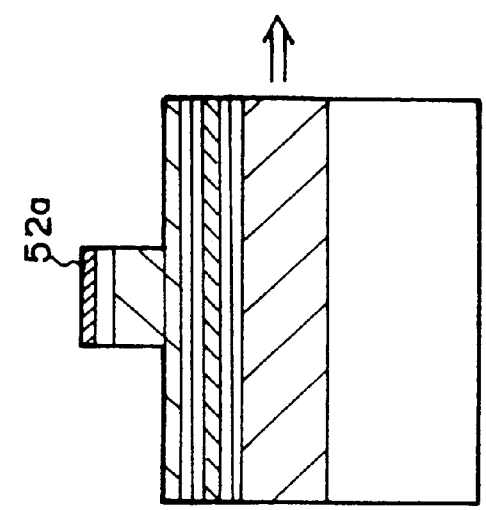
FIGS. 5A, 5B, 5C, 5D, 5E, and 5F are sectional views showing how a third embodiment of the semiconductor laser device in accordance with the present invention is produced.

As illustrated in FIG. 5A, an n-$Ga_{1-z1}Al_{z1}As$ cladding layer 42, an n- or i-$In_{x1}Ga_{1-x1}As_{1-y1}P_{y1}$ optical waveguide layer 43, an i-$In_{x2}Ga_{1-x2}As_{1-y2}P_{y2}$ tensile strained barrier layer 44, an $In_{x3}Ga_{1-x3}As_{1-y3}P_{y3}$ quantum well active layer 45, an i-$In_{x2}Ga_{1-x2}As_{1-y2}P_{y2}$ tensile strained barrier layer 46, a p- or i-$In_{x1}Ga_{1-x1}As_{1-y1}P_{y1}$ optical waveguide layer 47, a p-$In_{x4}(Ga_{1-z4}Al_{z4})_{1-x4}As_{0.2}P_{0.8}$ upper first cladding layer 48, a p-$In_{x5}(Ga_{1-z5}Al_{z5})_{1-x5}P$ upper second cladding layer 49, and a p-GaAs contact layer 50 are formed successively on an n-GaAs substrate 41 with a metalorganic chemical vapor deposition process. An insulating film 52, which may be constituted of $SiO_2$, or the like, is then formed on the contact layer 50.

Figure 5B:
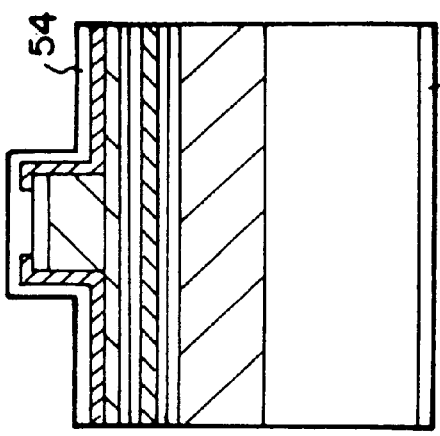
Figure 5C:
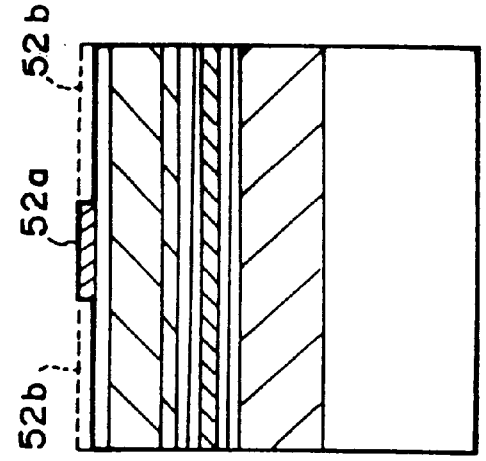
Figure 5D:
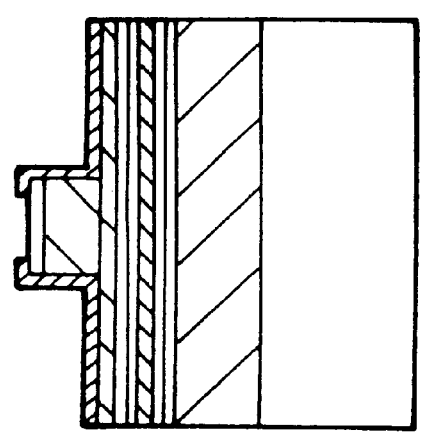
Figure 5E:
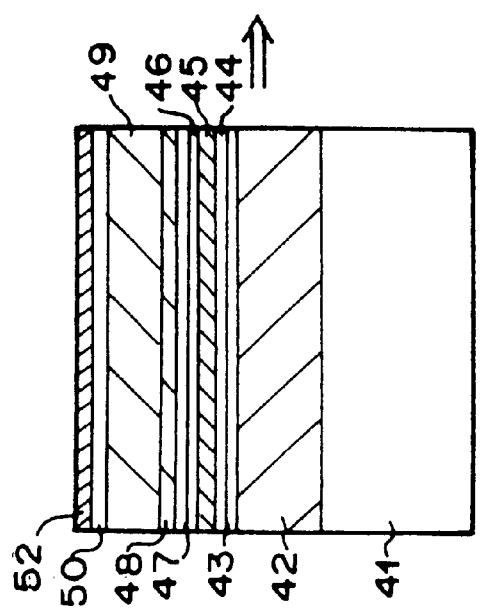
Figure 5F:
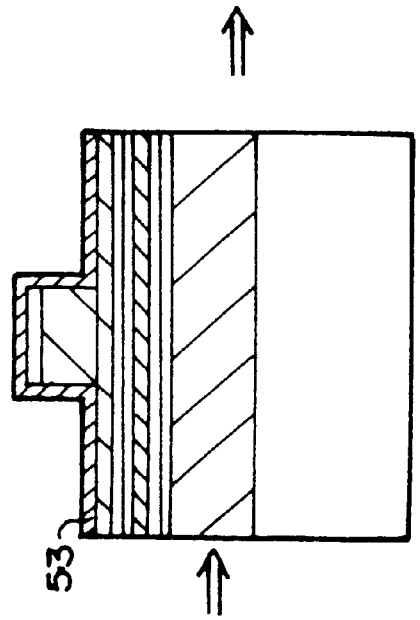

Thereafter, as illustrated in FIG. 5B, stripe portions 52b, 52b of the insulating film 52, each of which has a width of approximately 6 µm and which are located on opposite sides of a stripe portion 52a having a width of approximately 3 µm, are removed with an ordinary lithographic technique, such that the stripe portion 52a may not be removed. Also, as illustrated in FIG. 5C, the remaining stripe portion 52a of the insulating film 52 is utilized as a mask, and the epitaxial layers ranging from the contact layer 50 to the upper surface of the upper first cladding layer 48 are removed with a wet etching technique. In this manner, a ridge stripe is formed. At this time, in cases where a sulfuric acid-hydrogen peroxide type of etching liquid is employed for removing the contact layer 50, and a hydrochloric acid type of etching liquid is employed for removing the upper second cladding layer 49, the etching stops automatically at the upper first cladding layer 48. The thickness of the upper first cladding layer 48 is adjusted such that the refractive index guiding in a fundamental transverse mode through the ridge stripe waveguide, which has been formed in the manner described above, can be achieved until a laser beam having a high intensity is radiated. Thereafter, as illustrated in FIG. 5D, the insulating film 52a is removed, and an insulating film 53 is formed over the entire areas of the surfaces of the ridge portion and the exposed upper first cladding layer 48. As illustrated in FIG. 5E, the portion of the insulating film 53 at the top of the ridge stripe portion is then removed with an ordinary lithographic technique. Further, as illustrated in FIG. 5F, a p-side electrode 54 is formed such that it may cover the exposed contact layer 50. Thereafter, the bottom surface of the substrate 41 is polished, and an n-side electrode 55 is formed on the bottom surface of the substrate 41.

Thereafter, high-reflectivity coating is carried out on one of resonator surfaces, which have been formed by cleaving the sample, and low-reflectivity coating is carried out on the other resonator surface. Chip formation is then carried out. In this manner, the semiconductor laser device is formed. With the structure described above, a laser beam having a high intensity can be produced while the fundamental transverse mode is being kept.

A refractive index guiding laser having an embedded structure can be produced by repeating the growth process three times by using the same etching stop mechanism as that described above.

Figure 6:
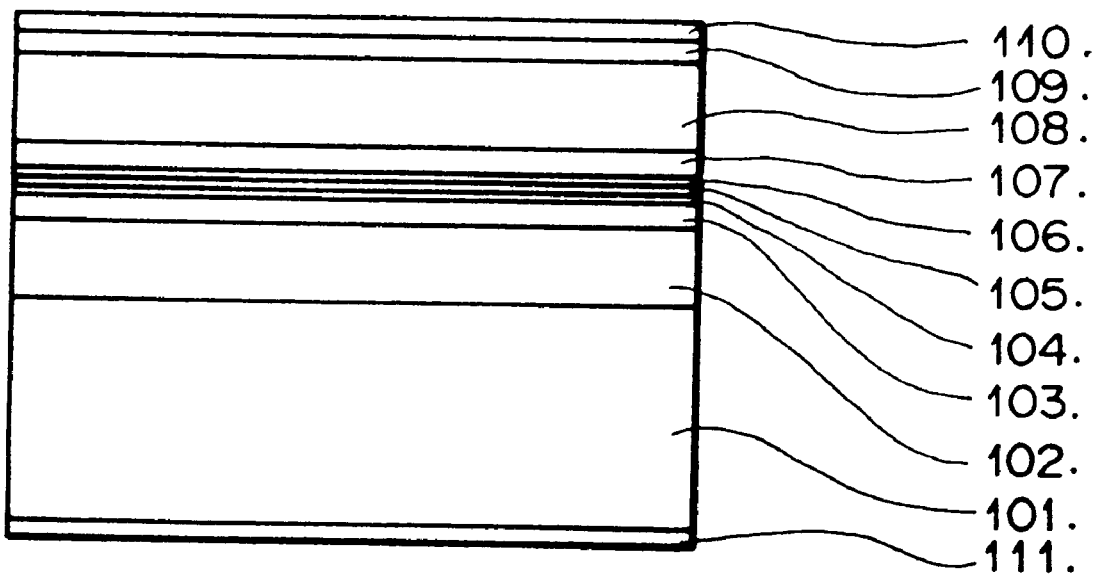
FIG. 6 is a sectional view showing a fourth embodiment of the semiconductor laser device in accordance with the present invention.

FIG. 6 is a sectional view showing a fourth embodiment of the semiconductor laser device in accordance with the present invention. The layer constitution of the fourth embodiment and how it is produced will be described hereinbelow.

As illustrated in FIG. 6, an n-$In_{0.48}Ga_{0.52}P$ cladding layer 102, an n- or i-$In_{x1}Ga_{1-x1}As_{1-y1}P_{y1}$ optical waveguide layer 103, an i-$In_{x2}Ga_{1-x2}As_{1-y2}P_{y2}$ tensile strained barrier layer 104, an $In_{x3}Ga_{1-x3}As_{1-y3}P_{y3}$ quantum well active layer 105, an i-$In_{x2}Ga_{1-x2}As_{1-y2}P_{y2}$ tensile strained barrier layer 106, a p- or i-$In_{x1}Ga_{1-x1}As_{1-y1}P_{y1}$ optical waveguide layer 107, a p-$In_{0.48}Ga_{0.52}P$ cladding layer 108, and a p-GaAs contact layer 109 are formed on an n-GaAs substrate 101 with a metalorganic chemical vapor deposition process. Thereafter, a p-side electrode 110 is formed on the contact layer 109. Thereafter, the bottom surface of the substrate 101 is polished, and an n-side electrode 111 is formed on the bottom surface of the substrate 101.

Thereafter, high-reflectivity coating is carried out on one of resonator surfaces, which have been formed by cleaving the sample along a plane normal to the plane of the sheet of FIG. 6, and low-reflectivity coating is carried out on the other resonator surface. In this manner, this embodiment of the semiconductor laser device is formed.

In the fourth embodiment, the quantum well active layer 105 has a composition, which is lattice matched with the GaAs substrate 101, or a composition, which has a tensile strain of a strain quantity of at most 0.003 with respect to the GaAs substrate 101. The quantum well active layer 105 may also have a multiple quantum well structure. However, the product of the tensile strain quantity of the active layer 105 and the total thickness (the total layer thickness) of the active layer 105 should be at most 0.1 nm.

The tensile strained barrier layers 104 and 106 are set such that the total layer thickness of the two barrier layers 104 and 106 may fall within the range of 10 nm to 30 nm, and such that the product of the strain quantity of each barrier layer and the total layer thickness may fall within the range of 0.05 nm to 0.2 nm. Each tensile strained barrier layer may be a ternary $In_{x2}Ga_{1-x2}P$ tensile strained barrier layer.

With the fourth embodiment, which has the structure described above, the same effects as those with the embodiments described above can be obtained.

Also, the fourth embodiment described above is constituted such that the electrode may be formed over the entire area of the surface of the contact layer 109. Alternatively, the semiconductor laser device in accordance with the present invention may be constituted as a gain guiding type of stripe laser, in which an insulating film having a stripe current injection window is formed on the contact layer 109. Also, the semiconductor layer constitution in the fourth embodiment of the semiconductor laser device may be employed for a semiconductor laser provided with a refractive index guiding mechanism, which is produced with ordinary photolithographic and dry etching techniques. The semiconductor layer constitution may also be employed for a semiconductor laser provided with a diffraction grating, an integrated optical circuit, and the like.

In the fourth embodiment described above, the GaAs substrate 101 has the n-type electrical conductivity. Alternatively, a substrate having the p-type electrical conductivity may be employed. In such cases, all of the electrical conductivity characteristics described above may be reversed.

Figure 7A:
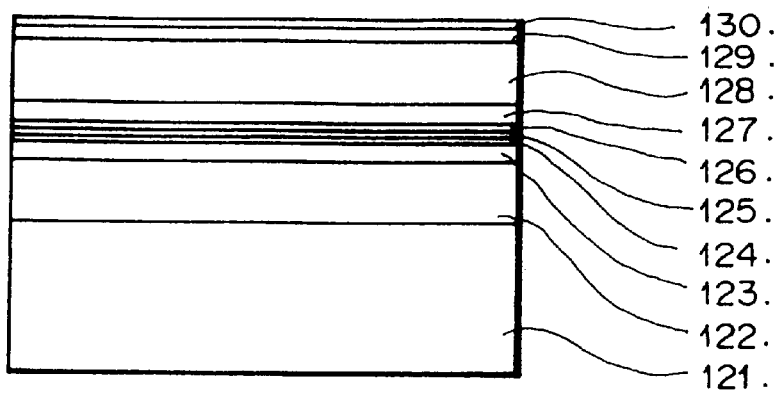
FIGS. 7A, 7B, and 7C are sectional views showing how a fifth embodiment of the semiconductor laser device in accordance with the present invention is produced.
Figure 7B:
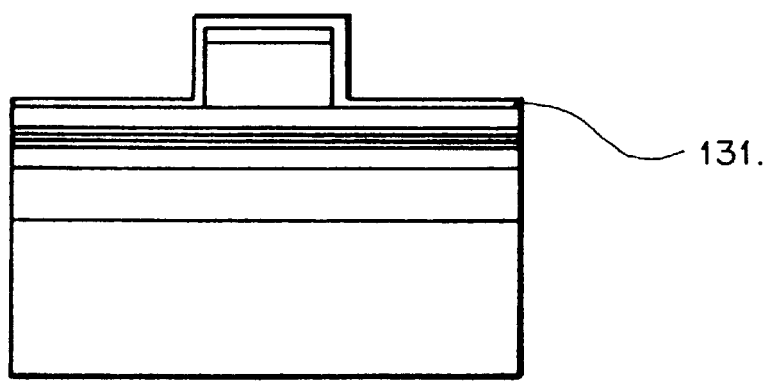
Figure 7C:
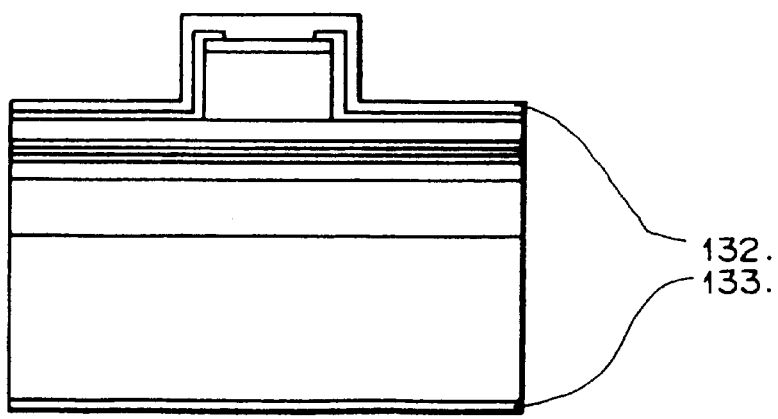

FIGS. 7A, 7B, and 7C are sectional views showing how a fifth embodiment of the semiconductor laser device in accordance with the present invention is produced. The layer constitution of the fifth embodiment and how it is produced will be described hereinbelow.

As illustrated in FIG. 7A, an n-$In_{0.48}Ga_{0.52}P$ cladding layer 122, an n- or i-$In_{x1}Ga_{1-x1}As_{1-y1}P_{y1}$ optical waveguide layer 123, an i-$In_{x2}Ga_{1-x2}P$ tensile strained barrier layer 124, an $In_{x3}Ga_{1-x3}As_{1-y3}P_{y3}$ quantum well active layer 125, an i-$In_{x2}Ga_{1-x2}P$ tensile strained barrier layer 126, a p- or i-$In_{x1}Ga_{1-x1}As_{1-y1}P_{y1}$ optical waveguide layer 127, a p-$In_{0.48}Ga_{0.52}P$ cladding layer 128, and a p-GaAs contact layer 129 are formed successively on an n-GaAs substrate 121 with a metalorganic chemical vapor deposition process. An insulating film 130, which may be constituted of $SiO_2$, or the like, is then formed on the contact layer 129.

Thereafter, stripe portions of the insulating film 130, each of which has a width of approximately 6 $\mu$m and which are located on opposite sides of a stripe portion having a width of approximately 3 $\mu$m that is located at the middle portion of the insulating film 130, are removed with an ordinary lithographic technique, such that the middle stripe portion may not be removed. Also, the stripe portion remaining at the middle portion of the insulating film 130 is utilized as a mask, and the epitaxial layers ranging from the p-GaAs contact layer 129 to the upper surface of the p- or i-$In_{x1}Ga_{1-x1}As_{1-y1}P_{y1}$ optical waveguide layer 127 are removed with a wet etching technique. In this manner, a ridge stripe is formed.

At this time, in cases where a sulfuric acid-hydrogen peroxide type of etching liquid is employed for etching the p-GaAs contact layer 129, and a hydrochloric acid type of etching liquid is employed for removing the p-$In_{0.48}Ga_{0.52}P$ cladding layer 128, the etching stops automatically at the upper surface of the p- or i-$In_{x1}Ga_{1-x1}As_{1-y1}P_{y1}$ optical waveguide layer 127. The thickness of the p- or i-$In_{x1}Ga_{1-x1}As_{1-y1}P_{y1}$ optical waveguide layer 127 is adjusted such that the refractive index guiding in a fundamental transverse mode through the ridge stripe waveguide, which has been formed in the manner described above at the middle portion of the resonator, can be achieved until a laser beam having a high intensity is radiated.

Thereafter, as illustrated in FIG. 7B, the insulating film 130 is removed, and an insulating film 131 is formed over the entire areas of the surfaces of the ridge portion and the exposed optical waveguide layer 127. As illustrated in FIG. 7C, the portion of the insulating film 131 at the top of the ridge stripe portion is then removed with an ordinary lithographic technique. Further, a p-side electrode 132 is formed such that it may cover the exposed contact layer 129. Thereafter, the bottom surface of the substrate 121 is polished, and an n-side electrode 133 is formed on the bottom surface of the substrate 121.

Thereafter, high-reflectivity coating is carried out on one of resonator surfaces, which have been formed by cleaving the sample, and low-reflectivity coating is carried out on the other resonator surface. Chip formation is then carried out. In this manner, the semiconductor laser device is formed.

With the structure described above, a laser beam having a wavelength of the 0.8 $\mu$m band, which has a high intensity, can be produced while the fundamental transverse mode is being kept.

In the manner described above, the narrow stripe fundamental transverse mode laser is formed. The structure described above is also applicable to a wide stripe multi-mode laser. In such cases, the thickness of the optical waveguide layer may be set such that it may fall within the range of 50 nm to 400 nm. Also, each tensile strained barrier layer may have a quarternary $In_{x2}Ga_{1-x2}As_{1-y2}P_{y2}$ composition.

Figure 8A:
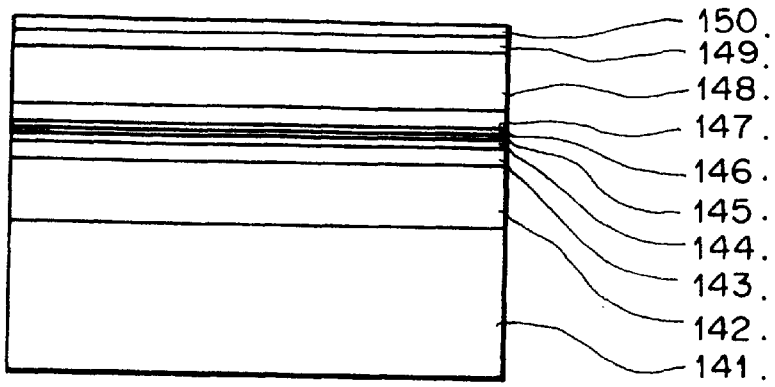
FIGS. 8A, 8B, and 8C are sectional views showing how a sixth embodiment of the semiconductor laser device in accordance with the present invention is produced.
Figure 8B:
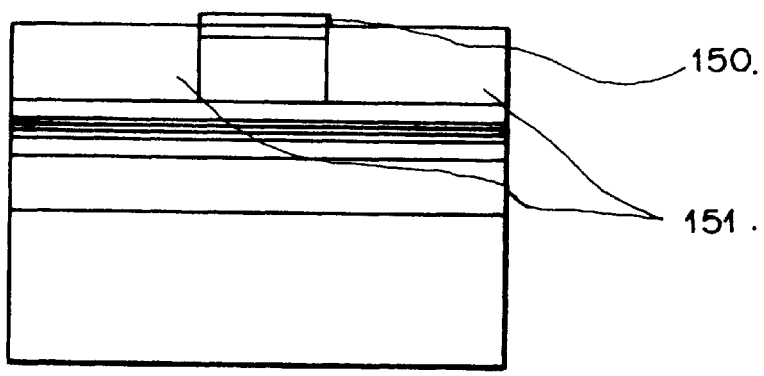
Figure 8C:
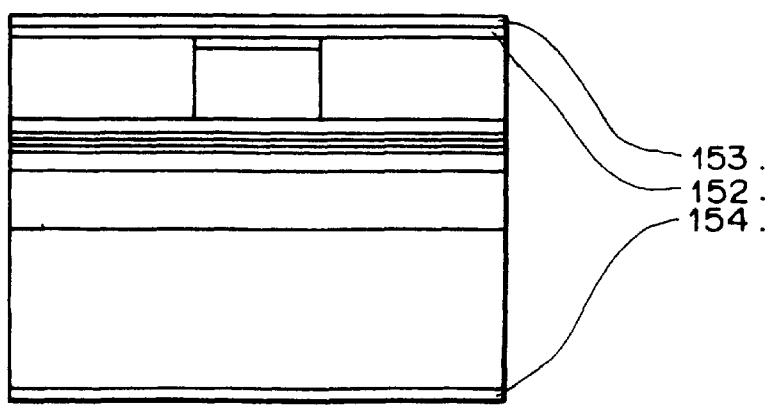

FIGS. 8A, 8B, and 8C are sectional views showing how a sixth embodiment of the semiconductor laser device in accordance with the present invention is produced. The layer constitution of the sixth embodiment and how it is produced will be described hereinbelow.

As illustrated in FIG. 8A, an n-$In_{0.48}Ga_{0.52}P$ cladding layer 142, an n- or i-$In_{x1}Ga_{1-x1}As_{1-y1}P_{y1}$ optical waveguide layer 143, an i-$In_{x2}Ga_{1-x2}As_{1-y2}P_{y2}$ tensile strained barrier layer 144, an $In_{x3}Ga_{1-x3}As_{1-y3}P_{y3}$ quantum well active layer 145, an i-$In_{x2}Ga_{1-x2}As_{1-y2}P_{y2}$ tensile strained barrier layer 146, a p- or i-$In_{x1}Ga_{1-x1}As_{1-y1}P_{y1}$ optical waveguide layer 147, a p-$In_{0.48}Ga_{0.52}P$ cladding layer 148, and a p-GaAs capping layer 149 are formed successively on an n-GaAs substrate 141 with a metalorganic chemical vapor deposition process. An insulating film 150, which may be constituted of $SiO_2$, or the like, is then formed on the capping layer 149.

Thereafter, stripe portions of the insulating film 150, each of which has a width of approximately 6 $\mu$m and which are located on opposite sides of a stripe portion having a width of approximately 3 $\mu$m that is located at the middle portion of the insulating film 150, are removed with an ordinary lithographic technique, such that the middle stripe portion may not be removed. Also, the stripe portion remaining at the middle portion of the insulating film 150 is utilized as a mask, and the epitaxial layers ranging from the p-GaAs capping layer 149 to the upper surface of the p- or i-$In_{x1}Ga_{1-x1}As_{1-y1}P_{y1}$ optical waveguide layer 147 are removed with a wet etching technique. In this manner, a ridge stripe is formed.

At this time, in cases where a sulfuric acid-hydrogen peroxide type of etching liquid is employed for etching the p-GaAs capping layer 149, and a hydrochloric acid type of etching liquid is employed for removing the p-$In_{0.48}Ga_{0.52}P$ cladding layer 148, the etching stops automatically at the upper surface of the p- or i-$In_{x1}Ga_{1-x1}As_{1-y1}P_{y1}$ optical waveguide layer 147.

Thereafter, as illustrated in FIG. 8B, an n-$In_{0.48}(Al_{z1}Ga_{1-z1})_{0.52}P$ current blocking layer 151 is formed through selective growth. The current blocking layer 151 has a refractive index smaller than that of the cladding layer 148, has a thickness of approximately 1 $\mu$m, and is lattice matched with the substrate 141.

The composition of the n-$In_{0.48}(Al_{z1}Ga_{1-z1})_{0.52}P$ current blocking layer 151 and the thickness of the p- or i-$In_{x1}$ $Ga_{1-x1}As_{1-y1}P_{y1}$ optical waveguide layer 147 are adjusted such that the refractive index guiding in a fundamental transverse mode through the ridge stripe waveguide, which has been formed in the manner described above at the middle portion of the resonator, can be achieved until a laser beam having a high intensity is radiated.

Thereafter, as illustrated in FIG. 8C, the insulating film 150 is removed, and a p-GaAs contact layer 152 is formed. Also, a p-side electrode 153 is formed on the p-GaAs contact layer 152. Thereafter, the bottom surface of the substrate 141 is polished, and an n-side electrode 154 is formed on the bottom surface of the substrate 141.

Thereafter, high-reflectivity coating is carried out on one of resonator surfaces, which have been formed by cleaving the sample, and low-reflectivity coating is carried out on the other resonator surface. Chip formation is then carried out. In this manner, the semiconductor laser device is formed.

With the structure described above, a laser beam having a wavelength of the 0.8 μm band, which has a high intensity, can be produced while the fundamental transverse mode is being kept.

In the manner described above, the narrow stripe fundamental transverse mode laser is formed. The structure described above is also applicable to a wide stripe multimode laser. In such cases, the thickness of the optical waveguide layer may be set such that it may fall within the range of 50 nm to 400 nm. Also, each tensile strained barrier layer may have a ternary $In_{x2}Ga_{1-x2}P$ composition.

Figure 9A:
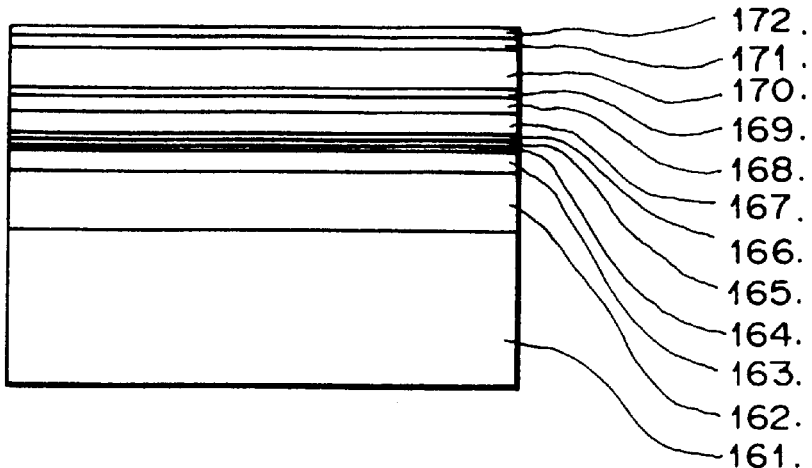
FIGS. 9A, 9B, and 9C are sectional views showing how a seventh embodiment of the semiconductor laser device in accordance with the present invention is produced.
Figure 9B:
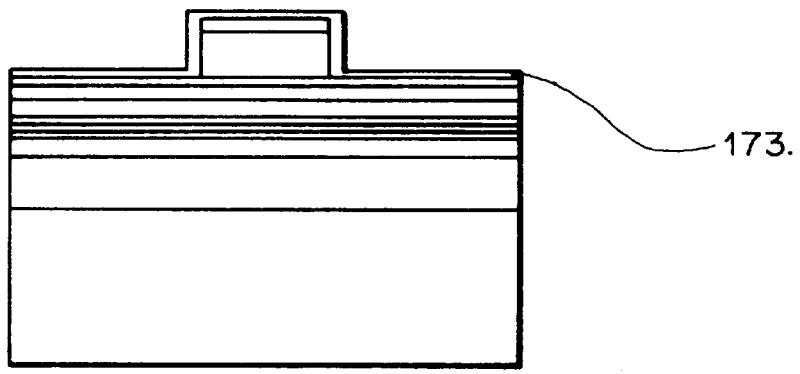
Figure 9C:
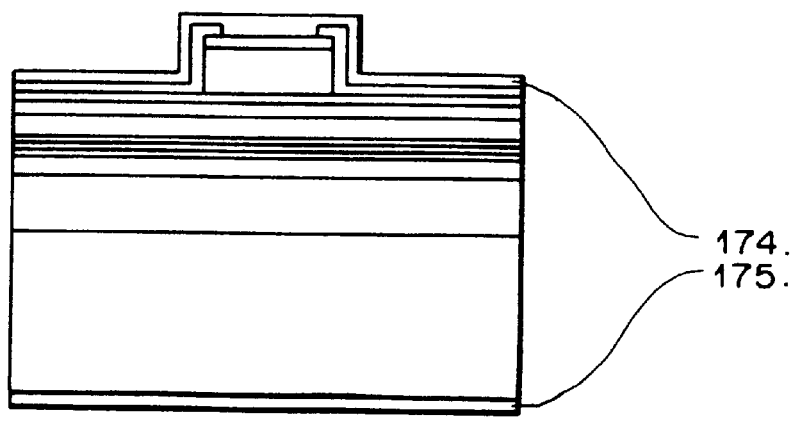

FIGS. 9A, 9B, and 9C are sectional views showing how a seventh embodiment of the semiconductor laser device in accordance with the present invention is produced. The layer constitution of the seventh embodiment and how it is produced will be described hereinbelow.

As illustrated in FIG. 9A, an $n-In_{0.48}Ga_{0.52}P$ cladding layer 162, an n- or $i-In_{x1}Ga_{1-x1}As_{1-y1}P_{y1}$ optical waveguide layer 163, an $i-In_{x2}Ga_{1-x2}As_{1-y2}P_{y2}$ tensile strained barrier layer 164, an $In_{x3}Ga_{1-x3}As_{1-y3}P_{y3}$ quantum well active layer 165, an $i-In_{x2}Ga_{1-x2}As_{1-y2}P_{y2}$ tensile strained barrier layer 166, a p- or $i-In_{x1}Ga_{1-x1}As_{1-y1}P_{y1}$ optical waveguide layer 167, a $p-In_{0.48}Ga_{0.52}P$ upper first cladding layer 168, a $p-In_{x4}Ga_{1-x4}As_{1-y4}P_{y4}$ etching blocking layer 169 (having a thickness of approximately 10 nm), a $p-In_{0.48}Ga_{0.52}P$ upper second cladding layer 170, and a p-GaAs contact layer 171 are formed successively on an n-GaAs substrate 161 with a metalorganic chemical vapor deposition process. An insulating film 172, which may be constituted of $SiO_2$, or the like, is then formed on the p-GaAs contact layer 171. The $p-In_{x4}Ga_{1-x4}As_{1-y4}P_{y4}$ etching blocking layer 169 has a composition, which is lattice matched with the substrate 161 and has a band gap larger than that of the quantum well active layer 165.

Thereafter, stripe portions of the insulating film 172, each of which has a width of approximately 6 μm and which are located on opposite sides of a stripe portion having a width of approximately 3 μm that is located at the middle portion of the insulating film 172, are removed with an ordinary lithographic technique, such that the middle stripe portion may not be removed. Also, the stripe portion remaining at the middle portion of the insulating film 172 is utilized as a mask, and the epitaxial layers ranging from the p-GaAs contact layer 171 to the upper surface of the $p-In_{x4}Ga_{1-x4}As_{1-y4}P_{y4}$ etching blocking layer 169 are removed with a wet etching technique. In this manner, a ridge stripe is formed.

At this time, in cases where a sulfuric acid-hydrogen peroxide type of etching liquid is employed for etching the p-GaAs contact layer 171, and a hydrochloric acid type of etching liquid is employed for removing the $p-In_{0.48}Ga_{0.52}P$ upper second cladding layer 170, the etching stops automatically at the upper surface of the $p-In_{x4}Ga_{1-x4}As_{1-y4}P_{y4}$ etching blocking layer 169.

The thickness of the p- or $I-In_{x1}Ga_{1-x1}As_{1-y1}P_{y1}$ optical waveguide layer 167 and the thickness of the $p-In_{0.48}Ga_{0.52}P$ upper first cladding layer 168 are adjusted such that the refractive index guiding in a fundamental transverse mode through the ridge stripe waveguide, which has been formed in the manner described above at the middle portion of the resonator, can be achieved until a laser beam having a high intensity is radiated.

Thereafter, as illustrated in FIG. 9B, the insulating film 172 is removed, and an insulating film 173 is formed. As illustrated in FIG. 9C, the portion of the insulating film 173 at the top of the ridge stripe portion is then removed with an ordinary lithographic technique. Further, a p-side electrode 174 is formed such that it may cover the exposed contact layer 171. Thereafter, the bottom surface of the substrate 161 is polished, and an n-side electrode 175 is formed on the bottom surface of the substrate 161.

Thereafter, high-reflectivity coating is carried put on one of resonator surfaces, which have been formed by cleaving the sample, and low-reflectivity coating is carried out on the other resonator surface. Chip formation is then carried out. In this manner, the semiconductor laser device is formed.

With the structure described above, a laser beam having a wavelength of the 0.8 μm band, which has a high intensity, can be produced while the fundamental transverse mode is being kept.

In the manner described above, the narrow stripe fundamental transverse mode laser is formed. The structure described above is also applicable to a wide stripe multimode laser. In such cases, the total thickness of the optical waveguide layer and the upper first cladding layer may be set such that it may fall within the range of 100 nm to 400 nm. Also, each tensile strained barrier layer may have a ternary $In_{x2}Ga_{1-x2}P$ composition.

Figure 10:
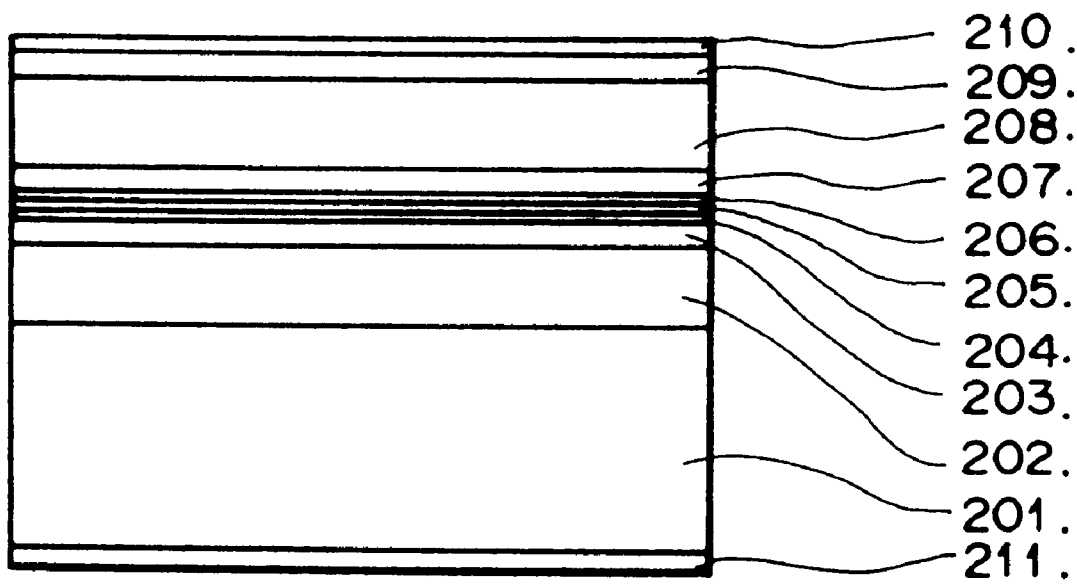
FIG. 10 is a sectional view showing an eighth embodiment of the semiconductor laser device in accordance with the present invention.

FIG. 10 is a sectional view showing an eighth embodiment of the semiconductor laser device in accordance with the present invention. The layer constitution of the eighth embodiment and how it is produced will be described hereinbelow.

As illustrated in FIG. 10, an $n-In_{0.48}(Al_zGa_{1-z})_{0.52}P$ cladding layer 202, an n- or $i-In_{x1}Ga_{1-x1}As_{1-y1}P_{y1}$ optical waveguide layer 203, an $i-In_{x2}Ga_{1-x2}As_{1-y2}P_{y2}$ tensile strained barrier layer 204, an $In_{x3}Ga_{1-x3}As_{1-y3}P_{y3}$ quantum well active layer 205, an $i-In_{x2}Ga_{1-x2}As_{1-y2}P_{y2}$ tensile strained barrier layer 206, a p- or $i-In_{x1}Ga_{1-x1}As_{1-y1}P_{y1}$ optical waveguide layer 207, a $p-In_{0.48}(Al_zGa_{1-z})_{0.52}P$ cladding layer 208, and a p-GaAs contact layer 209 are formed successively on an n-GaAs substrate 201 with a metalorganic chemical vapor deposition process.

Thereafter, a p-side electrode 210 is formed on the p-GaAs contact layer 209. Thereafter, the bottom surface of the substrate 201 is polished, and an n-side electrode 211 is formed on the bottom surface of the substrate 201. Thereafter, high-reflectivity coating is carried out on one of resonator surfaces, which have been formed by cleaving the sample, and low-reflectivity coating is carried out on the other resonator surface. Chip formation is then carried out. In this manner, the semiconductor laser device is formed.

With the structure described above, a laser beam having a wavelength of the 0.8 μm band, which has a high intensity, can be produced while the fundamental transverse mode is being kept.

Also, the eighth embodiment described above is constituted such that the electrode may be formed over the entire area of the surface of the contact layer 209. Alternatively, the semiconductor laser device in accordance with the present invention may be constituted as a gain guiding type of stripe laser, in which an insulating film stripe is formed on the structure described above. Also, the semiconductor layer constitution in the eighth embodiment of the semiconductor laser device may be employed for a semiconductor laser provided with a refractive index guiding mechanism, which is produced with ordinary photo-lithographic and dry etching techniques. The semiconductor layer constitution may also be employed for a semiconductor laser provided with a diffraction grating, an integrated optical circuit, and the like.

In the eighth embodiment described above, the GaAs substrate 201 has the n-type electrical conductivity. Alternatively, a substrate having the p-type electrical conductivity may be employed. In such cases, all of the electrical conductivity characteristics described above may be reversed.

The quantum well active layer 205 may also have a multiple quantum well structure. However, the product of the tensile strain quantity of the active layer 205 and the total thickness (the total layer thickness) of the active layer 205 should be at most 0.1 nm. Also, each tensile strained barrier layer may have a ternary $In_{x2}Ga_{1-x2}P$ composition.

Figure 11A:
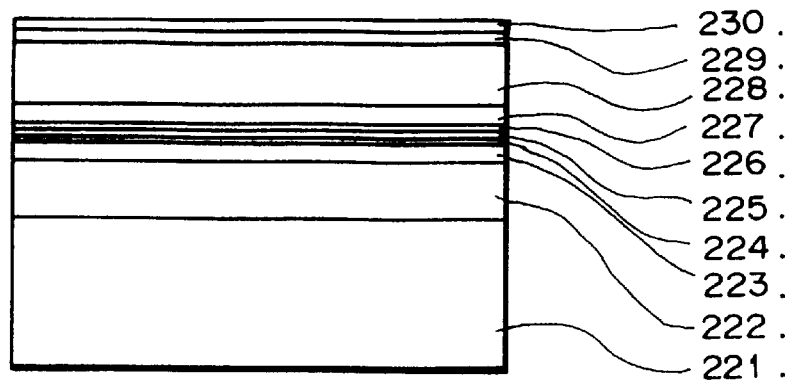
FIGS. 11A, 11B, and 11C are sectional views showing how a ninth embodiment of the semiconductor laser device in accordance with the present invention is produced.
Figure 11B:
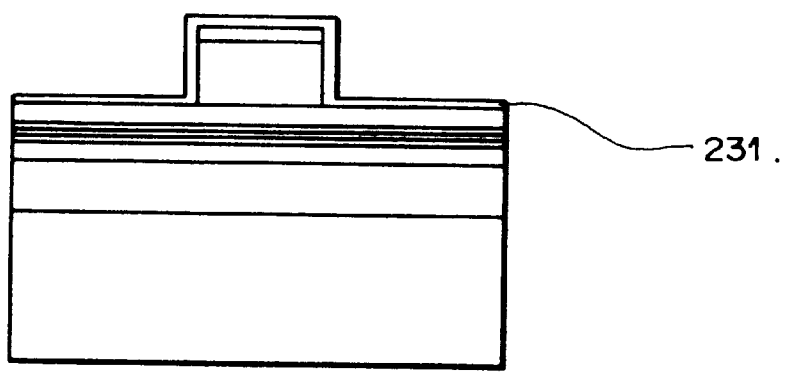
Figure 11C:
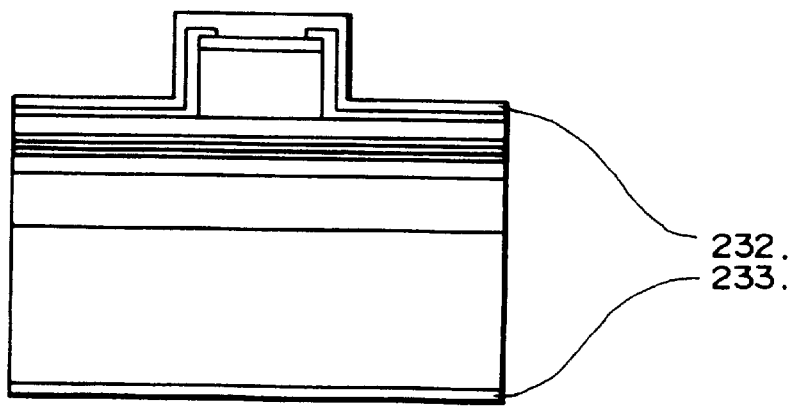

FIGS. 11A, 11B, and 11C are sectional views showing how a ninth embodiment of the semiconductor laser device in accordance with the present invention is produced. The layer constitution of the ninth embodiment and how it is produced will be described hereinbelow.

As illustrated in FIG. 11A, an n-$In_{0.48}(Al_zGa_{1-z})_{0.52}P$ cladding layer 222, an n- or i-$In_{x1}Ga_{1-x1}As_{1-y1}P_{y1}$ optical waveguide layer 223, an i-$In_{x2}Ga_{1-x2}P$ tensile strained barrier layer 224, an $In_{x3}Ga_{1-x3}As_{1-y3}P_{y3}$ quantum well active layer 225, an i-$In_{x2}Ga_{1-x2}P$ tensile strained barrier layer 226, a p- or i-$In_{x1}Ga_{1-x1}As_{1-y1}P_{y1}$ optical waveguide layer 227, a p-$In_{0.48}(Al_zGa_{1-z})_{0.52}P$ cladding layer 228, and a p-GaAs contact layer 229 are formed successively on an n-GaAs substrate 221 with a metalorganic chemical vapor deposition process.

Thereafter, stripe portions of the insulating film 230, each of which has a width of approximately 6 μm and which are located on opposite sides of a stripe portion having a width of approximately 3 μm that is located at the middle portion of the insulating film 230, are removed with an ordinary lithographic technique, such that the middle stripe portion may not be removed. Also, the stripe portion remaining at the middle portion of the insulating film 230 is utilized as a mask, and the epitaxial layers ranging from the p-GaAs contact layer 229 to the upper surface of the p- or i-$In_{x1}Ga_{1-x1}As_{1-y1}P_{y1}$ optical waveguide layer 227 are removed with a wet etching technique. In this manner, a ridge stripe is formed.

At this time, in cases where a sulfuric acid-hydrogen peroxide type of etching liquid is employed for etching the p-GaAs contact layer 229, and a hydrochloric acid type of etching liquid is employed for removing the p-$In_{0.48}(Al_zGa_{1-z})_{0.52}P$ cladding layer 228, the etching stops automatically at the upper surface of the p- or i-$In_{x1}Ga_{1-x1}As_{1-y1}P_{y1}$ optical waveguide layer 227. The thickness of the p- or i-$In_{x1}Ga_{1-x1}As_{1-y1}P_{y1}$ optical waveguide layer 227 is adjusted such that the refractive index guiding in a fundamental transverse mode through the ridge stripe waveguide, which has been formed in the manner described above at the middle portion of the resonator, can be achieved until a laser beam having a high intensity is radiated.

Thereafter, as illustrated in FIG. 11B, the insulating film 230 is removed, and an insulating film 231 is formed over the entire areas of the surfaces of the ridge portion and the exposed optical waveguide layer 227. As illustrated in FIG. 11C, the portion of the insulating film 231 at the top of the ridge stripe portion is then removed with an ordinary lithographic technique. Further, a p-side electrode 232 is formed such that it may cover the exposed contact layer 229. Thereafter, the bottom surface of the substrate 221 is polished, and an n-side electrode 233 is formed on the bottom surface of the substrate 221.

Thereafter, high-reflectivity coating is carried out on one of resonator surfaces, which have been formed by cleaving the sample, and low-reflectivity coating is carried out on the other resonator surface. Chip formation is then carried out. In this manner, the semiconductor laser device is formed.

With the structure described above, a laser beam having a wavelength of the 0.8 μm band, which has a high intensity, can be produced while the fundamental transverse mode is being kept.

In the manner described above, the narrow stripe fundamental transverse mode laser is formed. The structure described above is also applicable to a wide stripe multimode laser. In such cases, the thickness of the optical waveguide layer may be set such that it may fall within the range of 50 nm to 400 nm. Also, each tensile strained barrier layer may have a quarternary $In_{x2}Ga_{1-x2}As_{1-y2}P_{y2}$ composition.

Figure 12A:
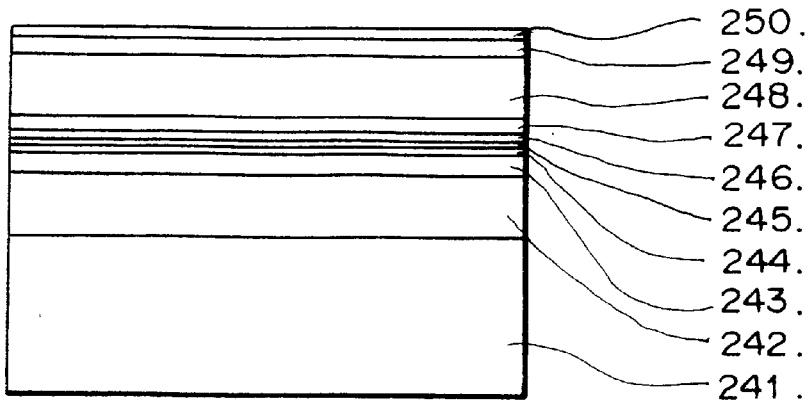
FIGS. 12A, 12B, and 12C are sectional views showing how a tenth embodiment of the semiconductor laser device in accordance with the present invention is produced.
Figure 12B:
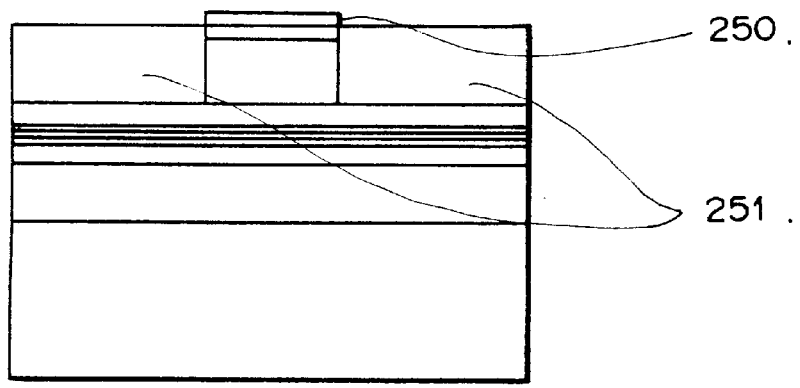
Figure 12C:
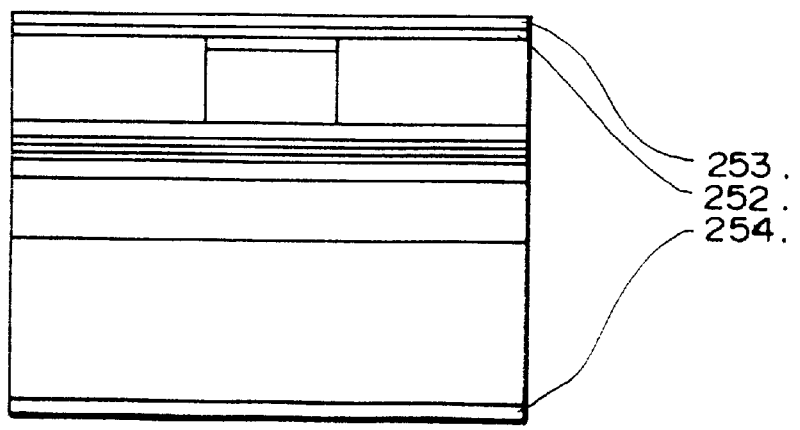

FIGS. 12A, 12B, and 12C are sectional views showing how a tenth embodiment of the semiconductor laser device in accordance with the present invention is produced. The layer constitution of the tenth embodiment and how it is produced will be described hereinbelow.

As illustrated in FIG. 12A, an n-$In_{0.48}(Al_zGa_{1-z})_{0.52}P$ cladding layer 242, an n- or i-$In_{x1}Ga_{1-x1}As_{1-y1}P_{y1}$ optical waveguide layer 243, an i-$In_{x2}Ga_{1-x2}As_{1-y2}P_{y2}$ tensile strained barrier layer 244, an $In_{x3}Ga_{1-x3}As_{1-y3}P_{y3}$ quantum well active layer 245, an i-$In_{x2}Ga_{1-x2}As_{1-y2}P_{y2}$ tensile strained barrier layer 246, a p- or i-$In_{x1}Ga_{1-x1}As_{1-y1}P_{y1}$ optical waveguide layer 247, a p-$In_{0.48}(Al_zGa_{1-z})_{0.52}P$ cladding layer 248, and a p-GaAs capping layer 249 are formed successively on an n-GaAs substrate 241 with a metalorganic chemical vapor deposition process. An insulating film 250, which may be constituted of $SiO_2$, or the like, is then formed on the capping layer 249.

Thereafter, stripe portions of the insulating film 250, each of which has a width of approximately 6 μm and which are located on opposite sides of a stripe portion having a width of approximately 3 μm that is located at the middle portion of the insulating film 250, are removed with an ordinary lithographic technique, such that the middle stripe portion may not be removed. Also, the stripe portion remaining at the middle portion of the insulating film 250 is utilized as a mask, and the epitaxial layers ranging from the p-GaAs capping layer 249 to the upper surface of the p- or i-$In_{x1}Ga_{1-x1}As_{1-y1}P_{y1}$ optical waveguide layer 247 are removed with a wet etching technique. In this manner, a ridge stripe is formed.

At this time, in cases where a sulfuric acid-hydrogen peroxide type of etching liquid is employed for etching the p-GaAs capping layer 249, and a hydrochloric acid type of etching liquid is employed for removing the p-$In_{0.48}(Al_zGa_{1-z})_{0.52}P$ cladding layer 248, the etching stops automatically at the upper surface of the p- or i-$In_{x1}Ga_{1-x1}As_{1-y1}P_{y1}$ optical waveguide layer 247.

Thereafter, as illustrated in FIG. 12B, an n-$In_{0.48}(Al_{z1}Ga_{1-z1})_{0.52}P$ current blocking layer 251 is formed through selective growth. The current blocking layer 251 has a refractive index smaller than that of the cladding layer 248, has a thickness of approximately 1 $\mu$m, and is lattice matched with the substrate 241.

The composition of the n-$In_{0.48}(Al_{z1}Ga_{1-z1})_{0.52}P$ current blocking layer 251 and the thickness of the p- or i-$In_{x1}Ga_{1-x1}As_{1-y1}P_{y1}$ optical waveguide layer 247 are adjusted such that the refractive index guiding in a fundamental transverse mode through the ridge stripe waveguide, which has been formed in the manner described above at the middle portion of the resonator, can be achieved until a laser beam having a high intensity is radiated.

Thereafter, as illustrated in FIG. 12C, the insulating film 250 is removed, and a p-GaAs contact layer 252 is formed. Also, a p-side electrode 253 is formed on the p-GaAs contact layer 252. Thereafter, the bottom surface of the substrate 241 is polished, and an n-side electrode 254 is formed on the bottom surface of the substrate 241.

Thereafter, high-reflectivity coating is carried out on one of resonator surfaces, which have been formed by cleaving the sample, and low-reflectivity coating is carried out on the other resonator surface. Chip formation is then carried out. In this manner, the semiconductor laser device is formed.

With the structure described above, a laser beam having a wavelength of the 0.8 $\mu$m band, which has a high intensity, can be produced while the fundamental transverse mode is being kept.

In the manner described above, the narrow stripe fundamental transverse mode laser is formed. The structure described above is also applicable to a wide stripe multi-mode laser. In such cases, the thickness of the optical waveguide layer may be set such that it may fall within the range of 50 nm to 400 nm. Also, each tensile strained barrier layer may have a ternary $In_{x2}Ga_{1-x2}P$ composition.

Figure 13A:
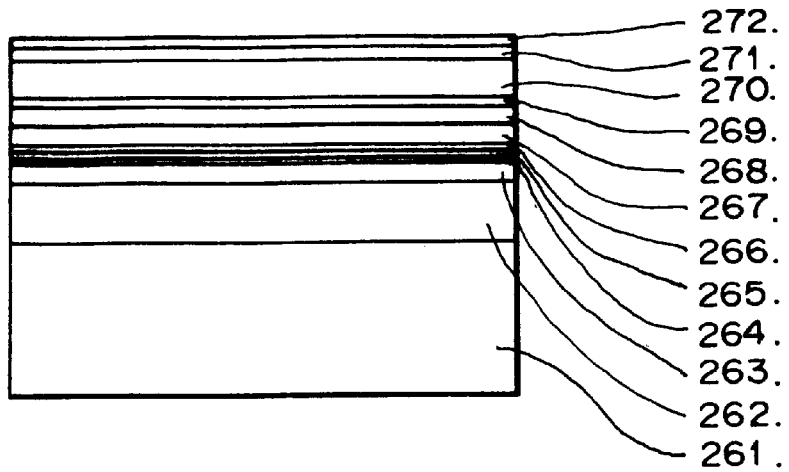
FIGS. 13A, 13B, and 13C are sectional views showing how an eleventh embodiment of the semiconductor laser device in accordance with the present invention is produced.
Figure 13B:
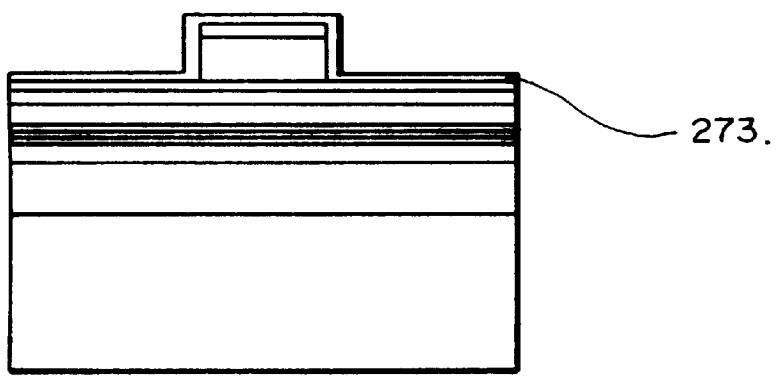
Figure 13C:
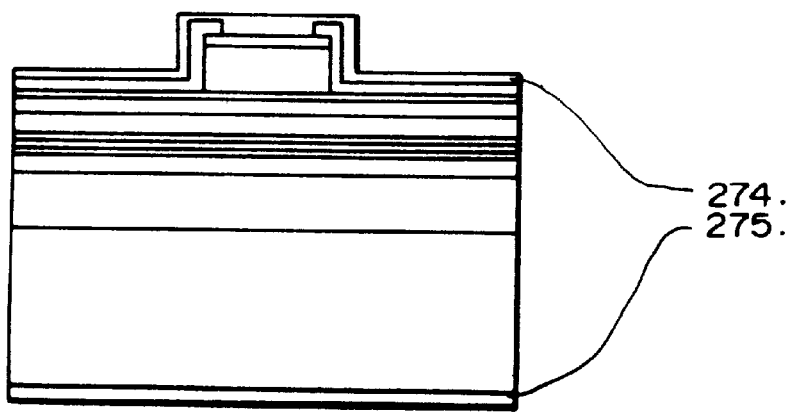

FIGS. 13A, 13B, and 13C are sectional views showing how an eleventh embodiment of the semiconductor laser device in accordance with the present invention is produced. The layer constitution of the eleventh embodiment and how it is produced will be described hereinbelow.

As illustrated in FIG. 13A, an n-$In_{0.48}(Al_zGa_{1-z})_{0.52}P$ cladding layer 262, an n- or i-$In_{x1}Ga_{1-x1}As_{1-y1}P_{y1}$ optical waveguide layer 263, an i-$In_{x2}Ga_{1-x2}As_{1-y2}P_{y2}$ tensile strained barrier layer 264, an $In_{x3}Ga_{1-x3}As_{1-y3}P_{y3}$ quantum well active layer 265, an i-$In_{x2}Ga_{1-x2}As_{1-y2}P_{y2}$ tensile strained barrier layer 266, a p- or i-$In_{x1}Ga_{1-x1}As_{1-y1}P_{y1}$ optical waveguide layer 267, a p-$In_{0.48}(Al_zGa_{1-z})_{0.52}P$ upper first cladding layer 268, a p-$In_{x4}Ga_{1-x4}As_{1-y4}P_{y4}$ etching blocking layer 269 (having a thickness of approximately 10 nm), a p-$In_{0.48}(Al_zGa_{1-z})_{0.52}P$ upper second cladding layer 270, and a p-GaAs contact layer 271 are formed successively on an n-GaAs substrate 261 with a metalorganic chemical vapor deposition process. An insulating film 272, which may be constituted of $SiO_2$, or the like, is then formed on the p-GaAs contact layer 271. The p-$In_{x4}Ga_{1-x4}As_{1-y4}P_{y4}$ etching blocking layer 269 has a composition, which is lattice matched with the substrate 261 and has a band gap larger than that of the quantum well active layer 265.

Thereafter, stripe portions of the insulating film 272, each of which has a width of approximately 6 $\mu$m and which are located on opposite sides of a stripe portion having a width of approximately 3 $\mu$m that is located at the middle portion of the insulating film 272, are removed with an ordinary lithographic technique, such that the middle stripe portion may not be removed. Also, the stripe portion remaining at the middle portion of the insulating film 272 is utilized as a mask, and the epitaxial layers ranging from the p-GaAs contact layer 271 to the upper surface of the p-$In_{x4}Ga_{1-x4}As_{1-y4}P_{y4}$ etching blocking layer 269 are removed with a wet etching technique. In this manner, a ridge stripe is formed.

At this time, in cases where a sulfuric acid-hydrogen peroxide type of etching liquid is employed for etching the p-GaAs contact layer 271, and a hydrochloric acid type of etching liquid is employed for removing the p-$In_{0.48}(Al_zGa_{1-z})_{0.52}P$ upper second cladding layer 270, the etching stops automatically at the upper surface of the p-$In_{x4}Ga_{1-x4}As_{1-y4}P_{y4}$ etching blocking layer 269.

The thickness of the p- or i-$In_{x1}Ga_{1-x1}As_{1-y1}P_{y1}$ optical waveguide layer 267 and the thickness of the p-$In_{0.48}(Al_zGa_{1-z})_{0.52}P$ upper first cladding layer 268 are adjusted such that the refractive index guiding in a fundamental transverse mode through the ridge stripe waveguide, which has been formed in the manner described above at the middle portion of the resonator, can be achieved until a laser beam having a high intensity is radiated.

Thereafter, as illustrated in FIG. 13B, the insulating film 272 is removed, and an insulating film 273 is formed. As illustrated in FIG. 13C, the portion of the insulating film 273 at the top of the ridge stripe portion is then removed with an ordinary lithographic technique. Further, a p-side electrode 274 is formed such that it may cover the exposed contact layer 271. Thereafter, the bottom surface of the substrate 261 is polished, and an n-side electrode 275 is formed on the bottom surface of the substrate 261.

Thereafter, high-reflectivity coating is carried out on one of resonator surfaces, which have been formed by cleaving the sample, and low-reflectivity coating is carried out on the other resonator surface. Chip formation is then carried out. In this manner, the semiconductor laser device is formed.

With the structure described above, a laser beam having a wavelength of the 0.8 $\mu$m band, which has a high intensity, can be produced while the fundamental transverse mode is being kept.

In the manner described above, the narrow stripe fundamental transverse mode laser is formed. The structure described above is also applicable to a wide stripe multi-mode laser. In such cases, the total thickness of the optical waveguide layer and the upper first cladding layer may be set such that it may fall within the range of 100 nm to 400 nm. Also, each tensile strained barrier layer may have a ternary $In_{x2}Ga_{1-x2}P$ composition.

In the eleventh embodiment described above, the GaAs substrate 261 has the n-type electrical conductivity. Alternatively, a substrate having the p-type electrical conductivity may be employed. In such cases, all of the electrical conductivity characteristics described above may be reversed.

The embodiments described above have the structures referred to as SQW-SCH, wherein a single quantum well is provided and the compositions of the optical waveguide layers are identical with each other. The semiconductor laser device in accordance with the present invention is also applicable to an MQW structure, wherein a plurality of quantum wells are provided.

Also, the composition ratio of the $In_{x3}Ga_{1-x3}As_{1-y3}P_{y3}$ quantum well active layer, or the like, may be adjusted such that a laser beam having a wavelength falling within the range of 750 nm$<\lambda<$850 nm may be radiated.

Further, as the semiconductor layer growth method, besides the metalorganic chemical vapor deposition process described above, it is also possible to employ the molecularbeam epitaxial growth method utilizing a solid or a gas as the raw material.

The semiconductor laser device in accordance with the present invention can also be utilized as a light source for use in the fields of quick information processing, quick image processing, communication, measurement, medical applications, printing, and the like.

What is claimed is:

1. A semiconductor laser device, comprising: a GaAs substrate, a first cladding layer, which has either one of p-type electrical conductivity and n-type electrical conductivity, a first optical waveguide layer, an $In_{x2}Ga_{1-x2}As_{1-y2}P_{y2}$ first barrier layer, an $In_{x3}Ga_{1-x3}As_{1-y3}P_{y3}$ quantum well active layer, an $In_{x2}Ga_{1-x2}As_{1-y2}P_{y2}$ second barrier layer, a second optical waveguide layer, and a second cladding layer, which has the other electrical conductivity, the layers being overlaid in this order on the GaAs substrate, wherein each of the first cladding layer and the second cladding layer has a composition, which is lattice matched with the GaAs substrate, each of the first optical waveguide layer and the second optical waveguide layer has a composition, which is lattice matched with the GaAs substrate, each of the first barrier layer and the second barrier layer has a tensile strain with respect to the GaAs substrate and is set such that a total layer thickness of the first barrier layer and the second barrier layer may fall within the range of 10 nm to 30 nm, and such that a product of a strain quantity of the tensile strain and the total layer thickness may fall within the range of 0.05 nm to 0.2 nm, and the $In_{x3}Ga_{1-x3}As_{1-y3}P_{y3}$ quantum well active layer has a composition selected from the group consisting of a composition, which is lattice matched with the GaAs substrate, and a composition, which has a tensile strain of at most 0.003 with respect to the GaAs substrate.

2. A semiconductor laser device, comprising: a GaAs substrate, a first cladding layer, which has either one of p-type electrical conductivity and n-type electrical conductivity, a first optical waveguide layer, an $In_{x2}Ga_{1-x2}P$ first barrier layer, an $In_{x3}Ga_{1-x3}As_{1-y3}P_{y3}$ quantum well active layer, an $In_{x2}Ga_{1-x2}P$ second barrier layer, a second optical waveguide layer, and a second cladding layer, which has the other electrical conductivity, the layers being overlaid in this order on the GaAs substrate, wherein each of the first cladding layer and the second cladding layer has a composition, which is lattice matched with the GaAs substrate, each of the first optical waveguide layer and the second optical waveguide layer has a composition, which is lattice matched with the GaAs substrate, each of the first barrier layer and the second barrier layer has a tensile strain with respect to the GaAs substrate and is set such that a total layer thickness of the first barrier layer and the second barrier layer may fall within the range of 10 nm to 30 nm, and such that a product of a strain quantity of the tensile strain and the total layer thickness may fall within the range of 0.05 nm to 0.2 nm, and the $In_{x3}Ga_{1-x3}As_{1-y3}P_{y3}$ quantum well active layer has a composition selected from the group consisting of a composition, which is lattice matched with the GaAs substrate, and a composition, which has a tensile strain of at most 0.003 with respect to the GaAs substrate.

* * * * *